(12) United States Patent
Bang et al.

(10) Patent No.: US 10,564,350 B2
(45) Date of Patent: Feb. 18, 2020

(54) FLAT PANEL DISPLAY EMBEDDING OPTICAL IMAGING SENSOR

(71) Applicant: LG DISPLAY CO., LTD., Seoul (KR)

(72) Inventors: Hyungseok Bang, Goyang-si (KR); Cheolse Kim, Daegu (KR); Buyeol Lee, Goyang-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 15/582,001

(22) Filed: Apr. 28, 2017

(65) Prior Publication Data

US 2017/0315293 A1   Nov. 2, 2017

(30) Foreign Application Priority Data

Apr. 29, 2016  (KR) .................. 10-2016-0053569

(51) Int. Cl.
*G06F 3/042*  (2006.01)
*G02B 6/12*  (2006.01)
(Continued)

(52) U.S. Cl.
CPC .......... *G02B 6/12004* (2013.01); *G02B 5/32* (2013.01); *G02B 6/0035* (2013.01); *G02B 6/102* (2013.01); *G06F 3/042* (2013.01); *G06K 9/00013* (2013.01); *G06K 9/00046* (2013.01); *H01L 27/3234* (2013.01); *G02B 6/002* (2013.01); *G02B 6/0016* (2013.01);
(Continued)

(58) Field of Classification Search
CPC . G02F 1/13338; G06F 3/0421; G02B 6/0018; G02B 6/34; G09G 3/3225

USPC ............ 345/173, 175, 176; 349/58; 359/34; 385/37
See application file for complete search history.

(56) References Cited

U.S. PATENT DOCUMENTS 5,745,266 A *  4/1998  Smith ................... B60Q 1/30
                                                    359/34
7,845,841 B2 * 12/2010  Sampsell ............ G02B 6/0048
                                                    359/34
(Continued)

FOREIGN PATENT DOCUMENTS

CN    105184282 A    12/2015
EP    3 196 802 A1    7/2017
(Continued)

OTHER PUBLICATIONS

Extended European Search Report, dated Sep. 26, 2017, for European Application No. 17168110.9-1562, 12 pages.
(Continued)

*Primary Examiner* — Audrey Y Chang
(74) *Attorney, Agent, or Firm* — Seed IP Law Group LLP

(57) ABSTRACT

The present disclosure relates to a flat panel display embedding an optical imaging sensor such as a fingerprint image sensor. The present disclosure suggests a flat panel display embedding an image sensor comprising: a display panel including a display area and a non-display area; and a directional optical unit having a length and a width corresponding to the display panel and a thickness, and attached on a top surface of the display panel, wherein the directional optical unit provides a sensing light to the display area, and wherein the sensing light is collimated and directionized to a predetermined direction.

26 Claims, 10 Drawing Sheets

(51) Int. Cl.
    *F21V 8/00*     (2006.01)
    *G06K 9/00*     (2006.01)
    *G02B 5/32*     (2006.01)
    *G02B 6/10*     (2006.01)
    *H01L 27/32*    (2006.01)
    *G06F 3/041*    (2006.01)
    *G02F 1/1333*   (2006.01)

(52) U.S. Cl.
    CPC ........ *G02F 1/13338* (2013.01); *G06F 3/0412* (2013.01); *G06F 2203/04109* (2013.01); *G06K 9/0008* (2013.01)

(56) References Cited

U.S. PATENT DOCUMENTS

| | | | |
|---|---|---|---|
| 8,564,314 | B2 | 10/2013 | Shaikh et al. |
| 9,280,237 | B2 | 3/2016 | Kukulj |
| 9,829,614 | B2 | 11/2017 | Smith et al. |
| 9,841,563 | B2 | 12/2017 | Lapstun |
| 9,881,547 | B2* | 1/2018 | Eom .................. G09G 3/3225 |
| 2004/0252867 | A1 | 12/2004 | Lan et al. |
| 2007/0013679 | A1 | 1/2007 | Gruhlke |
| 2008/0055502 | A1* | 3/2008 | Wu .................. G02F 1/13338 349/38 |
| 2010/0142892 | A1* | 6/2010 | Kuittinen .............. G02B 6/34 385/37 |
| 2012/0223916 | A1* | 9/2012 | Kukulj .................. G06F 3/0421 345/175 |
| 2013/0021300 | A1 | 1/2013 | Wassvik |
| 2013/0063399 | A1 | 3/2013 | Noro et al. |
| 2013/0307818 | A1 | 11/2013 | Pope et al. |
| 2016/0139402 | A1 | 5/2016 | Lapstun |
| 2016/0224816 | A1 | 8/2016 | Smith et al. |
| 2016/0342282 | A1* | 11/2016 | Wassvik .............. G02F 1/13338 |
| 2017/0372113 | A1 | 12/2017 | Zhang et al. |
| 2018/0005003 | A1 | 1/2018 | Ryu et al. |
| 2018/0322325 | A1 | 11/2018 | Lee et al. |

FOREIGN PATENT DOCUMENTS

| | | |
|---|---|---|
| KR | 10-0608171 B1 | 8/2006 |
| KR | 10-2011-0095565 A | 8/2011 |
| KR | 10-1432988 B1 | 8/2014 |
| KR | 10-2015-00078823 A | 7/2015 |
| KR | 10-2016-0043216 A | 4/2016 |
| WO | 2009/020940 A1 | 2/2009 |
| WO | 2015/108477 A1 | 7/2015 |

OTHER PUBLICATIONS

Li et al., "Infrared refractive indices of liquid crystals," Journal of Applied Physics 97(7):073501, 2005. (5 pages).

Li et al., "Refractive Indices of Liquid Crystals for Display Applications," IEEE/OSA Journal of Display Technology 1(1):51-61, 2005.

Office Action, dated Nov. 27, 2018, for U.S. Appl. No. 15/969,600, Lee et al., "Flat Panel Display Embedding Optical Imaging Sensor," 13 pages.

* cited by examiner $T_{CP\_AIR} < \alpha < T_{VHOE\_LR} < \theta$ ex) $45° < \alpha < 55°$
$70° < \theta < 75°$ $$T_{CP\_AIR} < \alpha < T_{VHOE\_LR} < \theta < \delta$$

ex) $45° \leq \alpha \leq 55°$
$70° \leq \theta \leq 75°$
$80° \leq \delta$ $\tan 20° \approx 0.364$ $x \approx \dfrac{0.5}{0.364} \approx 1.37$ $x \approx \dfrac{0.3}{0.364} \approx 0.82$

FLAT PANEL DISPLAY EMBEDDING OPTICAL IMAGING SENSOR

BACKGROUND

Technical Field

The present disclosure relates to a flat panel display embedding an optical imaging sensor such as a fingerprint image sensor. In particular, the present disclosure relates to a flat panel display embedding an optical imaging sensor including an ultra thin substrate providing the directional lights and an optical imaging sensor.

Description of the Related Art

Various computer based systems including the notebook computer, the tablet personal computer (or, PC), the smart phone, the personal digital assistants, the automated teller machines and/or the search information system have been developed. As these devices use and store the various personal information as well as the business information and the trade secrets, it is desirable to strengthen the securities for preventing these important data being leaked.

To do so, one method has been suggested for strengthening the security using an image sensor recognizing the authorized user's biological information. For example, the fingerprint sensor is generally used for enhancing the security when registering and authenticating is performed. The fingerprint sensor is for sensing the fingerprint of user. The fingerprint sensor may be categorized into the optical fingerprint sensor and the capacitive fingerprint sensor.

The optical fingerprint sensor uses a light source such as a light emitting diode (or LED) to irradiate lights and detects the lights reflected by the ridge of the fingerprint using a CMOS (or, complementary metal oxide semiconductor) image sensor. As the optical fingerprint sensor may scan the fingerprint using the LED lights, it is required that the sensor is equipped with an additional device for performing the scan process. There is a limitation to increasing the size of the object for scanning the image. Therefore, there are limitations for applying the optical fingerprint sensor to various applications such as combining with the display devices.

For conventional optical fingerprint sensors, known are a Korean patent 10-060817 registered on Jun. 26, 2006 of which title is "A display apparatus having fingerprint identification sensor" and a Korean patent application 10-2016-0043216 published on Apr. 21, 2016 of which title is "Display device including fingerprinting device".

The above mentioned optical fingerprint sensor is configured to use the display area as the touch area for inputting the user's selection and the sense area for sensing the fingerprint. However, this optical fingerprint sensor uses the diffused (or diverged) lights having very low directivity. Therefore, there is a limitation to recognize the exact fingerprint pattern. When using the collimated lights such as the infrared laser having high directivity, it is very hard to generate the sensing lights to cover the wider area. Therefore, the fingerprint sensing area is restricted in a small area. In order to radiate the collimated lights over the wider scan area, specific scanning structure is required, so that this system is not suitable for portable or personal display apparatus.

Therefore, for portable devices embedding the fingerprint sensor, the capacitive fingerprint sensor is mainly used. However, the capacitive fingerprint sensor also has many problems.

The capacitive fingerprint sensor is configured to detect the difference of the electricity between the ridge and the valley of the fingerprint contacting on the fingerprint sensor. For conventional capacitive fingerprint sensors, known is a US patent application 2013/0307818 published on Nov. 21, 2013 of which title is "Capacitive Sensor Packaging".

The above mentioned capacitive fingerprint sensor is configured as an assembly type embedding with a specific push button. It comprises a capacitive plate and a silicon wafer having a circuit for detecting a capacitive storage amount between the ridge and valley of the fingerprint. Generally, as the sizes of the ridge and valley of the fingerprint are very tiny, about 300~500 µm (micrometer), the capacitive fingerprint sensor needs a high resolution sensor array and an integrated chip (or IC) for processing the fingerprint detection. To do so, the silicon wafer is configured to include the sensor array and the IC on one substrate.

However, when the high resolution sensor array and the IC are formed on the same silicon wafer, the assembly structure for joining the push button with the fingerprint sensor is required. Therefore, the structure would be very complex and further the non-display area (or bezel area) may be increased. In some cases, the push button (i.e., the home key of the smart phone) would be overlapped with the fingerprint sensor, so that the thickness of the whole device would be thick. Further, the sensing area for the fingerprint would be dependent on the size of the push button.

To solve above mentioned problems and limitations, some technologies have been suggested in which the touch sensor area is used for sensing the fingerprint. For example, known are U.S. Pat. No. 8,564,314 issued on Oct. 22, 2013 of which title is "Capacitive touch sensor for identifying a fingerprint", and Korean patent 10-1432988 registered on Aug. 18, 2014 of which title is "A capacitive touch screen for integrated of fingerprint recognition".

In general cases of the personal portable devices such as the smart phones, an additional transparent film is attached for protecting the display glass panel. When the above mentioned technologies are applied to the personal portable devices, as attaching the protective film thereon, the performance for sensing or recognizing the fingerprint exactly would be remarkably degraded. In general, even though the protective film is attached, the touch function may be properly operated. However, the detection ability for the difference of the capacitive storage amount for sensing the fingerprint may be deteriorated by the protective film even though its thickness is very thin.

For a display embedding the capacitive fingerprint sensor, generally a protective film or a hardening glass may be further attached on the cover glass of the display. In that case, the recognition ability may be deteriorated. That is, the total thickness of the cover glass may affect the sensitivity of the capacitive fingerprint sensor. In the interim, the diffused lights used in the sensing light source may affect the sensitivity of the optical fingerprint sensor. When using the collimated lights for enhancing the sensitivity of the optical fingerprint sensor, the bulky and/or complex optical devices are required so that it is very hard to apply to a display for personal mobile device.

SUMMARY

In order to overcome the above mentioned drawbacks, a purpose of the present disclosure is to provide a flat panel display embedding an ultra thin optical image sensor (or an optical image recognition apparatus). Another purpose of the present disclosure is to provide a flat panel display having an optical image sensor in which most or all of a surface of the display panel may be used for the sensing area. Still another purpose of the present disclosure is to provide a flat panel display embedding an optical image sensor in which a directional light is used as a sensing light covering a large surface area. Yet another purpose of the present disclosure is to provide a flat panel display embedding an ultra thin and large area optical image sensor of which resolution and sensitivity are very high and/or superior.

In order to accomplish one or more of the above purposes, the present disclosure provides a flat panel display embedding an image sensor comprising: a display panel including a display area and a non-display area; and a directional optical unit having a length along a length axis of the display panel and a width along a width axis of the display panel and a thickness along a thickness axis of the display panel, and attached on a top surface of the display panel, wherein the directional optical unit provides a sensing light to the display area, and wherein the sensing light is collimated and directionized to a predetermined direction.

In one embodiment, the directional optical unit includes: a cover plate having a size corresponding to the length and the width; a light radiating film corresponding to the display area under the cover plate; a light incident film disposed outside of the display area at one lateral side of the light radiating film, under the cover plate; a low refractive layer disposed under the light radiating film and the light incident film, attached on the top surface of the display panel, and having a refractive index lower than the cover plate and the light radiating film; and a light source disposed at the lateral side of the display panel or under the display panel as facing with the light incident film.

In one embodiment, the light source provides an incident light to an incident point defined on a surface of the light incident film; wherein the light incident film includes a first holographic pattern for converting the incident light to a propagating light having an incident angle satisfying an internal total reflection condition of the cover plate, and for sending the propagating light in the cover plate; and wherein the light radiating film includes a second holographic pattern for converting some of the propagating light to the sensing light having a reflection angle which satisfies a total reflection condition at the top surface of the cover plate and transmitting condition through the low refractive layer.

In one embodiment, the propagating light has an expanding angle on a horizontal plane including the length axis and the width axis, and maintains the collimated state on a vertical plane including the length axis and the thickness axis; wherein the incident angle is larger than an internal total reflection critical angle at a first interface between the light radiating film and the low refractive layer; and wherein the reflection angle is larger than a total reflection critical angle at a second interface between the cover plate and an air layer, and smaller than the internal total reflection critical angle at the first interface between the light radiating film and the low refractive layer.

In one embodiment, the expanding angle is at least equal to an inner angle between a first line and a second line, the first line is connecting the incident point and one end of an opposite side of the cover plate facing the light incident film, and the second line is connecting the incident point and other end of the opposite side of the cover plate.

In one embodiment, the directional optical unit further comprises: a horizontal collimating film disposed as being apart from the light incident film along a propagating direction of the propagating light and as having the width, wherein the expanding angle is at least equal to an inner angle between a first line and a second line, the first line is connecting the incident point and one end of the horizontal collimating film, and the second line is connecting the incident point and other end of the horizontal collimating film, and wherein the horizontal collimating film has a third holographic pattern for horizontally collimating the propagating light having the expanding angle on the horizontal plane to correspond to the width.

In one embodiment, the directional optical unit further comprises: a horizontal collimating film disposed in the non-display area at an opposite side of the cover plate facing the light incident film, wherein the light incident film includes a third holographic pattern for converting the incident light to a total reflecting light having a total reflection angle different from the incident angle, and for sending the total reflecting light to the cover plate, wherein the expanding angle is at least equal to an inner angle between a first line and a second line, the first line is connecting the incident point and one end of the horizontal collimating film, and the second line is connecting the incident point and other end of the horizontal collimating film, wherein the horizontal collimating film includes a fourth holographic pattern for horizontally collimating the propagating light having the expanding angle on the horizontal plane to correspond to the width, for converting the total reflecting light to the propagating light and for sending the propagating light to the light incident film, and wherein the second holographic pattern of the light radiating film is for transmitting the total reflecting light through.

The present disclosure provides a flat panel display embedding an optical image sensor that has a high resolution recognizing ability or sensitivity by providing the directionized lights (or 'oriented') as the sensing lights. Comparing with the diffused lights used in the conventional art for the fingerprint sensor, because that the directionized lights according to the present disclosure are used for sensing the image without any loss of lights, the present disclosure has the merits of the higher resolution and the superior sensitivity. The present disclosure provides a flat panel display embedding a large area optical image sensor in which a collimated infrared laser beam is expanded over a large area corresponding to the display panel for the sensing lights using a holography technology. The present disclosure provides a flat panel display having an ultra thin optical image sensor in which a direction light is provided on the display surface within a thin thickness. Further, according to the present disclosure, the protective substrate disposed on the topmost surface is used as the cover substrate of the direction optical substrate. Using a holographic film, the collimated light is provided as covering the large area corresponding to the display surface so that the present disclosure provides an ultra thin direction optical substrate. When joining the optical image sensor to the display device, the whole thickness of the display device is not thicker. As the image sensing area may be set freely within the display area of the display device, the flat panel display embedding an optical image sensor according to the present disclosure may be applied to various applications.

BRIEF DESCRIPTION OF THE SEVERAL VIEWS OF THE DRAWINGS

The accompanying drawings, which are included to provide a further understanding of the disclosure and are incorporated into and constitute a part of this specification, illustrate embodiments of the disclosure and together with the description serve to explain the principles of the disclosure.

In the drawings.

DETAILED DESCRIPTION

Figure 1:
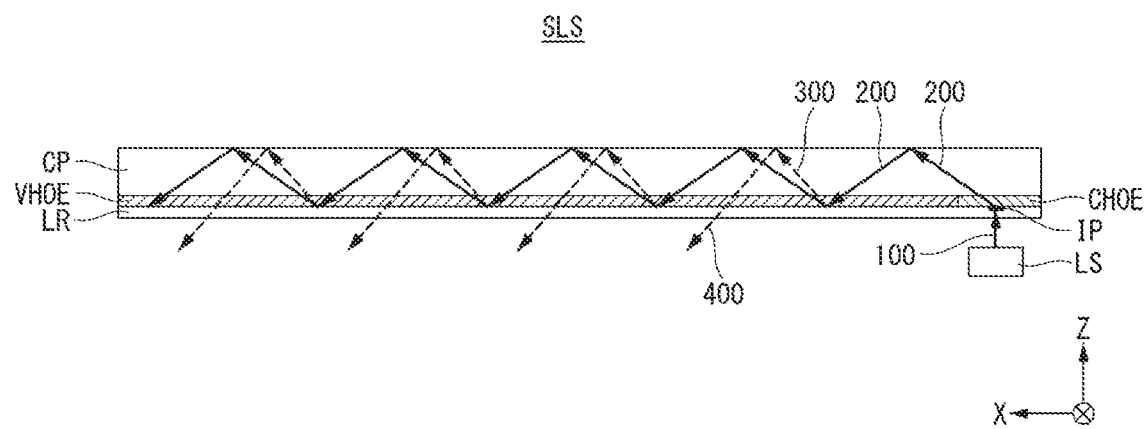
FIG. 1 is a drawing illustrating a structure of a directional optical substrate applied for a flat panel display embedding an optical image sensor according to a first embodiment of the present disclosure.
Figure 1:
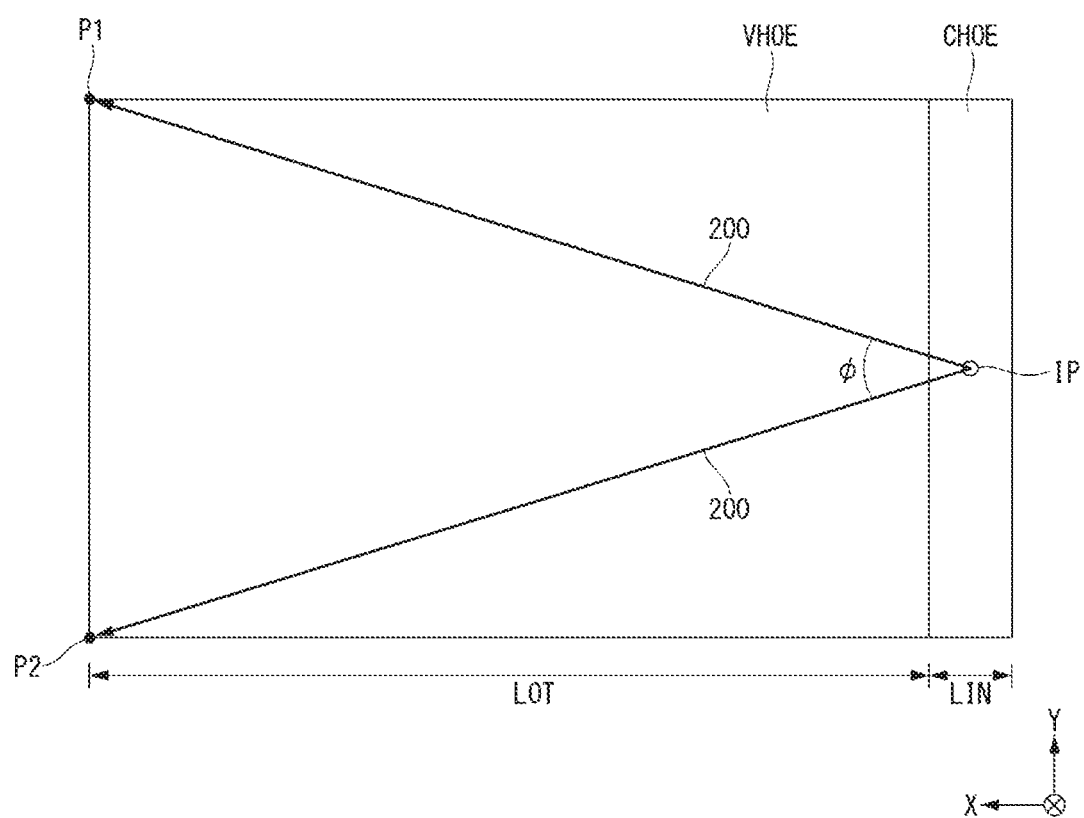

Referring to the attached figures, one or more preferred embodiments of the present disclosure will be described. Like reference numerals designate like elements throughout the detailed description. However, the present disclosure is not restricted by these embodiments but can be applied to various changes or modifications without changing the technical spirit of the disclosure. In the following embodiments, the names of the elements are selected by considering the easiness for explanation so that they may be different from actual names.

First Embodiment

Figure 2:
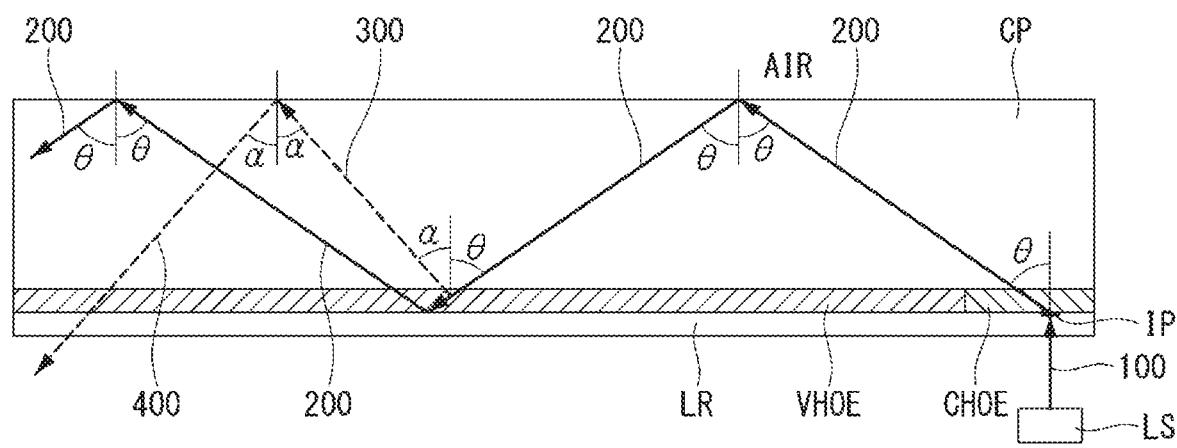
FIG. 2 is a cross sectional view illustrating light paths inside the directional optical substrate shown in FIG. 1.

Hereinafter, referring to FIGS. 1 and 2, a first embodiment of the present disclosure will be described. FIG. 1 is a drawing illustrating a structure of a directional optical substrate applied for a flat panel display embedding an optical image sensor according to the first embodiment of the present disclosure. In FIG. 1, the upper drawing is a side view on the XZ plane and the lower drawing is a plane view on the XY plane.

Referring to FIG. 1, a directional optical unit according to the first embodiment comprises a directional optical substrate SLS and a light source LS. The directional optical substrate SLS includes a cover plate CP, a light radiating film VHOE, a light incident film CHOE and a low refractive layer LR. The cover plate CP may have a rectangular plate shape of a length, a width and a thickness. In FIG. 1, the length is along X-axis, the width is along Y-axis and the thickness is along Z-axis.

The directional optical unit is an optical device for providing the collimated light expanded covering a large area corresponding to a surface of the display. Therefore, it is preferable that the light source LS provides a collimated light.

On a bottom surface of the cover plate CP, the light radiating film VHOE and the light incident film CHOE is attached. The light radiating film VHOE is an optical element for providing the radiating lights 300. It is preferable that the light radiating film VHOE is disposed as corresponding to the area for detecting and/or sensing the image.

The light incident film CHOE is an optical element for converting the collimated light provided from the light source into the lights expanded in the area of the cover plate CP. It is preferable that the light incident film CHOE is disposed outside of and adjacent to the light radiating film VHOE. Specifically, the light incident film CHOE is disposed as facing with the light source LS.

It is preferable that the light radiating film VHOE and the light incident film CHOE may be disposed on the same plane level. Considering the manufacturing process, it is further preferable that the light radiating film VHOE and the light incident film CHOE are formed as being separated each other, on a same film. The light radiating film VHOE and the light incident film CHOE may be optical elements having the holographic patterns. In this case, after disposing the master film for the light radiating film VHOE and the master film for the light incident film CHOE close each other, these two holographic patterns may be copied on one holographic recording film, at the same time.

Under the bottom surface of the light radiating film VHOE and the light incident film CHOE, a low refractive layer LR is disposed. It is preferable that the low refractive layer LR has the refractive index lower than that of the cover plate CP and the light radiating film VHOE. For example, the cover plate CP may be formed of a transparent reinforced glass having a refractive index of 1.5. The light radiating film VHOE and the light incident film CHOE may be the transparent holographic recording film and may have a refractive index that is the same as or slightly larger than that of the cover plated CP. Here, we use the case that the refractive index of the light radiating film VHOE and the light incident film CHOE are same as that of the cover plate CP. It is preferable that the refractive index of the low refractive layer LR is similar with the refractive index of the scanning objects. For example, when applying to the fingerprint sensor, the low refractive layer LR may have a refractive index of 1.4, which is similar with the refractive index of human skin, 1.39.

At the space under the light incident film CHOE, the light source LS is disposed as facing with the light incident film CHOE. It is preferable that the light source LS provides a highly collimated light such as a LASER beam. Specifically, when applying to the system in which the fingerprint sensor is embedded into a portable display, it is preferable that the light source LS provides the infrared laser beam which cannot be recognized by the human eyes.

The collimated light from the light source LS, as an incident light 100, having a predetermined cross sectional area is provided to a light incident point IP defined on the light incident film CHOE. It is preferable that the incident light 100 enters along the normal direction with respect to the surface of the incident point IP. However, embodiments provided by the present disclosure are not restricted as such. For example, in one or more embodiments, the incident light 100 may enter onto the incident point IP with an inclined angle with respect to the normal direction.

The light incident film CHOE converts the incident light 100 into a propagating light 200 having an incident angle and sends it into the cover plate CP. Here, it is preferable that the incident angle is larger than the internal total reflection critical angle of the cover plate CP. As the results, while repeating the total reflection, the propagating light 200 is propagated inside the cover plate CP along a direction of the X-axis, i.e., the length direction of the cover plate CP.

The light radiating film VHOE converts some amount of the propagating light 200 into the radiating light 300 and refracts the radiating light 300 to the upper surface of the cover plate CP. Other portions of the propagating light 200 would continuously be propagating inside the cover plate CP. The radiating light 300 is totally reflected at the upper surface of the cover plate CP, but it is transmitted through the low refractive layer LR at the bottom surface of the cover plate CP so that the radiating light 300 goes out of the directional optical substrate SLS. In other words, the radiating light 300 totally reflected at the upper surface of the cover plate CP would become a sensing light 400 after passing through the bottom surface of the cover plate CP.

As the propagating light 200 goes from the light incident film CHOE to an opposite side of the cover plate facing the light incident film, a predetermined portion of the propagating light 200 is extracted as the radiating lights 300 by the light radiating film VHOE. The amount (or 'brightness' or 'luminance') of the radiating light 300 is determined by the light extraction efficiency of the light radiating film VHOE. For example, when the light extraction efficiency of the light radiating film VHOE is 3%, then 3% of the initial light amount of the propagating light 200 would be extracted at the first radiating point where the propagating light 200 firstly hits to the light radiating film VHOE. Then, the 97% of the propagating light 200 would be totally reflected at the first radiating point and goes on continuously. After that, at the second radiating point, 3% of the 97%, i.e., 2.91% of the initial amount of the propagating light 200 would be extracted as the radiating light 300.

Repeating this operation, a plurality of radiating lights 300 would be extracted from the first side where the light incident film CHOE is located to the opposite side. When the light radiating film VHOE has the same light extraction efficiency over all areas, the amount of the propagating light 200 is gradually lowered as propagating from the first side to opposite side. In order to get an evenly distributed amount of the lights over the whole area of the light radiating area, it is preferable that the light extraction efficiency of the light radiating film VHOE is exponentially increased from the first side to the opposite side.

As observing the propagating light 200 on the XZ plane (or, 'vertical plane') having the length axis and the thickness axis, the collimated condition of the incident light 100 is maintained. On the contrary, on the XY plane (or, 'horizontal plane') having the length axis and the width axis, it is preferable that the propagating light 200 is a diverged (or, expanded) light having an expanding angle, φ. The reason of expanding the propagating light 200 is that the image sensing area is set as covering most of the area of the cover plate CP. For example, it is preferable that the light radiating film VHOE has an area corresponding to the whole area of the light going-out part LOT. Further, it is preferable that the expanding angle φ is the inner angle between two lines, one line is connecting the incident point IP and one end point P1 of the opposite side of the cover plate CP and the other line is connecting the incident point IP and another end point P2 of the opposite side of the cover plate CP.

The area where the light incident film CHOE is disposed would be defined as a light entering part LIN. The area where the light radiating film VHOE is disposed would be defined as a light going-out part LOT. The light going-out part LOT would be the light propagating part where the light is going through. In FIG. 1, the light incident film CHOE covers the whole area of the light entering part LIN, for convenience. However, it is enough that the light incident film CHOE has a size slightly larger than the size of the light incident point IP.

For example, the cross section of the collimated light generated from the light source LS may be a right circle shape of which radius is 0.5 mm. The light incident film CHOE would have the length corresponding to the width of the cover plate CP and the width of 3 mm~5 mm. The light incident film CHOE may be disposed as crossing the width of the cover plate CP.

Hereinafter, referring to FIG. 2, we will explain how the collimated infrared light provided from the light source is converted into a directional infrared light used for image sensing inside the directional optical substrate SLS. FIG. 2 is a cross sectional view illustrating light paths inside the directional optical substrate according to the FIG. 1.

The incident light 100 provided from the light source LS enters along the normal direction with respect to the surface of the incident point IP of the light incident film CHOE. The light incident film CHOE converts the incident light 100 into a propagating light 200 refracted as having an incident angle θ to the normal direction with respect to the surface of the incident point IP. And then, the light incident film CHOE provides the propagating light 200 to the inside space (or 'the media') of the cover plate CP.

It is preferable that the incident angle θ of the propagating light 200 is larger than the total reflection critical angle $T_{VHOE\_LR}$ at the interface between the light radiating film VHOE and the low refractive layer LR. For example, when the refraction index of the cover plate CP and the light radiating film VHOE is 1.5, and the refraction index of the low refractive layer LR is 1.4, it is preferable that the total reflection critical angle $T_{VHOE\_LR}$ at the interface between the light radiating film VHOE and the low refractive layer LR is greater than 69° (degrees). Therefore, it is preferable that the incident angle θ is larger than 69°. For example, the incident angle θ may be in the range of 70° to 75°, inclusive.

As the upper surface of the cover plate CP is in contact with the air AIR, the propagating light 200 is totally reflected at the upper surface of the cover plate CP. It is because that the total reflection critical angle $T_{CP\_AIR}$ at the interface between the cover plate CP and the air AIR is about 41.4°. That is, when the incident angle θ is larger than the total reflection critical angle $T_{VHOE\_LR}$ at the interface between the light radiating film VHOE and the low refractive layer LR, the incident angle θ is always larger than the total reflection critical angle $T_{CP\_AIR}$ at the interface between the cover plate CP and the air AIR.

The light radiating film VHOE converts a predetermined amount of the propagating light 200 into a radiating light 300 having a reflection angle α and sends the radiating light 300 back into the inner space of the cover plate CP. The radiating light 300 is for detecting an image of an object when the object is contacting on the upper surface of the cover plate CP. When there is no object on the outer surface of the cover plate CP, the radiating light 300 is totally reflected at the upper surface of the cover plate CP and then is provided to the photo sensor (or, optical sensor) disposed at the outside of the bottom surface of the directional optical substrate SLS. That is, after being totally reflected at the upper surface of the cover plate CP, the radiating light 300 goes out of the directional optical substrate SLS through the bottom surface of the cover plate CP. All of the sensing lights 400 have the same reflecting angle so that the sensing lights 400 are oriented (or 'directionized') to a predetermined direction.

Figure 3:
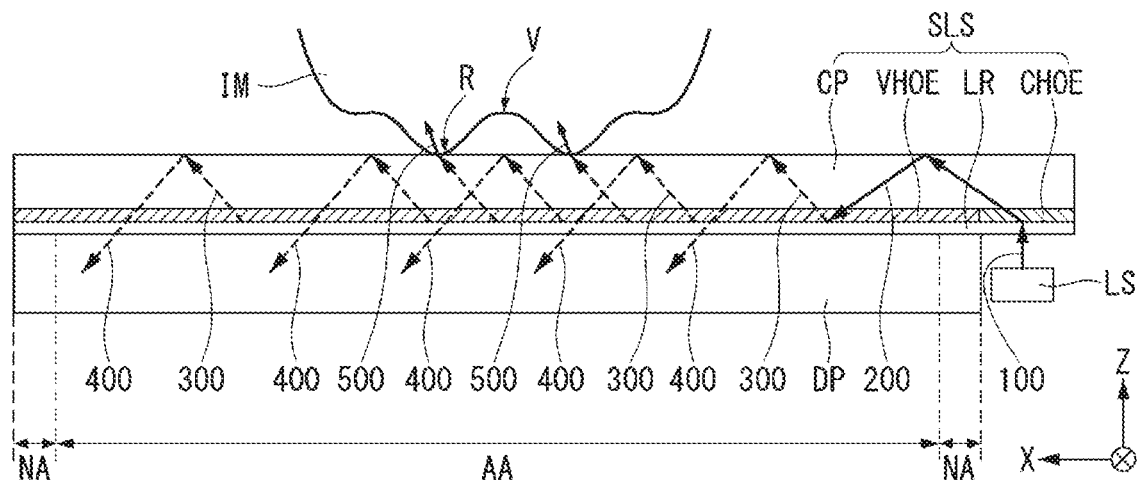
FIG. 3 is a drawing illustrating a structure of a flat panel display embedding an optical image sensor including a directional optical unit and an optical sensor, according to the first embodiment of the present disclosure.
Figure 3:
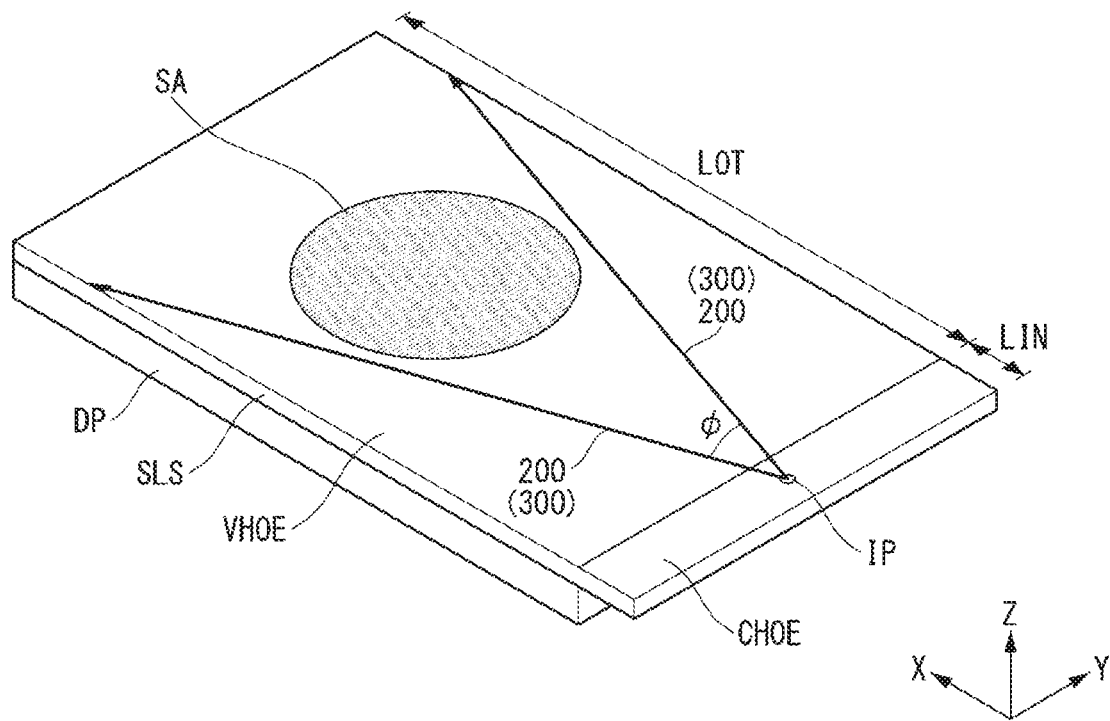

By detecting the sensing light 400 radiated out of the low refractive layer LR disposed under the bottom surface of the directional optical substrate SLS, the images of the object contacted on the upper surface of the cover plate CP may be recognized. Hereinafter, we will explain about the image sensing device applying the directional optical unit as shown in FIG. 1. Specifically, we focus on a flat panel display embedding a fingerprint recognizing sensor. FIG. 3 is a drawing illustrating a structure of a flat panel display embedding an optical image sensor including a directional optical unit and an optical sensor, according to the first embodiment of the present disclosure.

Referring to FIG. 3, a flat panel display embedding an optical image sensor according to the first embodiment of the present disclosure comprises a display panel DP, a directional optical substrate SLS and a light source LS. The display panel DP includes a display area AA and a non-display area NA. The display area AA may be disposed at the middle portions of the display panel DP. The non-display area NA may be surrounding the display area AA. The display area AA may have a plurality of the display elements for representing the video images shown on the display panel DP. The non-display area may have a plurality of the driving elements for operating the display elements arrayed in the display area AA.

In detail, a plurality of pixel areas for representing the video images may be arrayed in a matrix manner in the display area AA. In at least one of the pixel areas, one photo sensor may be included for detecting the image of the object. In some cases, one photo sensor may be disposed at one group of the pixel areas. For example, one photo sensor may be disposed at every pixel group including 2×2, 3×3 or 4×4 pixels.

The directional optical substrate SLS may be a thin plate having a predetermined length, width and thickness. It is preferable that the length and width of the directional optical substrate SLS has a size corresponding to the size of the display panel DP. Specifically, it is preferable that the directional optical substrate SLS has a size slightly larger than that of the display panel DP. At least, it is preferable that the directional optical substrate SLS has an extended (or expanded) area over one side of the display panel DP. At the extended side area over the display panel DP, the light source LS may be disposed.

The directional optical substrate SLS may be joined with the display panel DP as it is attached on the upper surface of the display panel DP. The directional optical substrate SLS includes a cover plate CP, a light incident film CHOE, a light radiating film VHOE and a low reflective layer LR, as mentioned above. It is preferable that the low refractive layer LR is attached on the upper surface of the display panel DP as facing each other. Here, the upper surface of the display panel DP is the front face providing the video images from the display panel DP. That is, the user observes the video image as seeing the upper surface of the display panel DP.

The directional optical substrate SLS, as mentioned above, may provide the image sensing light 400 to the bottom surface of the cover plate CP, which faces the upper surface of the display panel DP. Therefore, the photo sensor disposed in the display panel DP located under the directional optical substrate SLS may detect the image sensing light 400. As the results, the images of the object contacting on the upper surface of the directional optical substrate SLS may be recognized.

In detail, the radiating light 300 generated by the light radiating film VHOE of the directional optical substrate SLS would reach to the upper surface of the cover plate CP. When an object IM is disposed on the cover plate CP, the radiating light 300 that hits the areas where the object IM is not contacting the upper surface of the cover plate CP is totally reflected and provided to the display panel DP as the sensing light 400. On the contrary, the radiating light 300 that hits the area where the object IM is contacting the upper surface of the cover plate CP (e.g., at ridge R) is refracted and goes out through the cover plate CP. At the point where the object IM having a refraction index larger than that of air is contacting the upper surface of the cover plate CP, the radiating light 300 is not totally reflected but it is refracted into the object IM. That is, at the area where the object IM is contacting, the radiating light 300 would be an absorbed light 500 so that it is not provided to the photo sensor of the display panel DP.

As the results, the photo sensor of the display panel DP detects only the sensing lights 400 except the absorbed lights 500 among the radiating lights 300. Detecting the reflection patterns of the sensing lights 400 reflected at the top surface of the cover plate CP, the photo sensors of the display panel DP reproduces the patterns or images of the object IM.

When applying the directional optical unit to the fingerprint sensor, the object IM would be the finger of the human. The ridge R of the fingerprint is contacting on the top surface of the cover plate CP but the valley V of the fingerprint is not contacting with the top surface of the cover plate CP. The radiating lights 300 that hit the upper surface of the cover plate CP at the valley V are totally reflected to be the sensing lights 400. In the interim, the radiating lights 300 that hit the upper surface of the cover plate CP at the ridge R are refracted so that they would be the absorbed lights 500 going out of the cover plate CP.

Further referring to the lower drawing of FIG. 3, we will explain about the process of the image sensing on the XY plane. The incident light 100 may include a collimated infrared light having a predetermined cross sectional area. The light source LS may be an infrared LASER diode (or 'IR LD').

The incident light 100 would be converted to a propagating light 200 by the light incident film CHOE. Here, the propagating light 200 would be expanded as having an expanding angle φ on the XY plane including the length axis on the X axis and the width axis on the Y axis. In the interim, on the XZ plane including the length axis on the X axis and the thickness axis on the Z axis, the initial collimated condition would be maintained.

Here, it is preferable that the expanding angle φ is equal to or slightly larger than the inner angle of two lines connecting from the light incident point IP to the two end points (i.e., the two corners at the opposite side) of the cover plate CP facing the light incident film CHOE, respectively. In this case, the propagating light 200 may be expanded as having a triangular shape. As the results, the radiating lights 300 may covers the same area covered as the propagating light 200 is expanded. That is, the image sensing area would be defined inside the triangular shape. When applying with the fingerprint sensor, the fingerprint sensing area SA may be defined as the circle area hatched in FIG. 3.

When setting the sensing area SA on the center portion or on upside-shifted portion facing with the light incident film CHOE, it is preferable that the amount (or luminance or brightness) of the radiating lights 300 has a maximum value. To do so, the light radiating film VHOE may be designed as having varying light extraction efficiency according to the functional relationship with the position (i.e., the light radiating film VHOE may have a light extraction efficiency that varies as a function of position along the light radiating film VHOE), to have the maximum value at the area corresponding to the sensing area SA and to have a minimum or zero value at the other areas (i.e., at areas outside of the sensing area SA).

Second Embodiment

Figure 4:
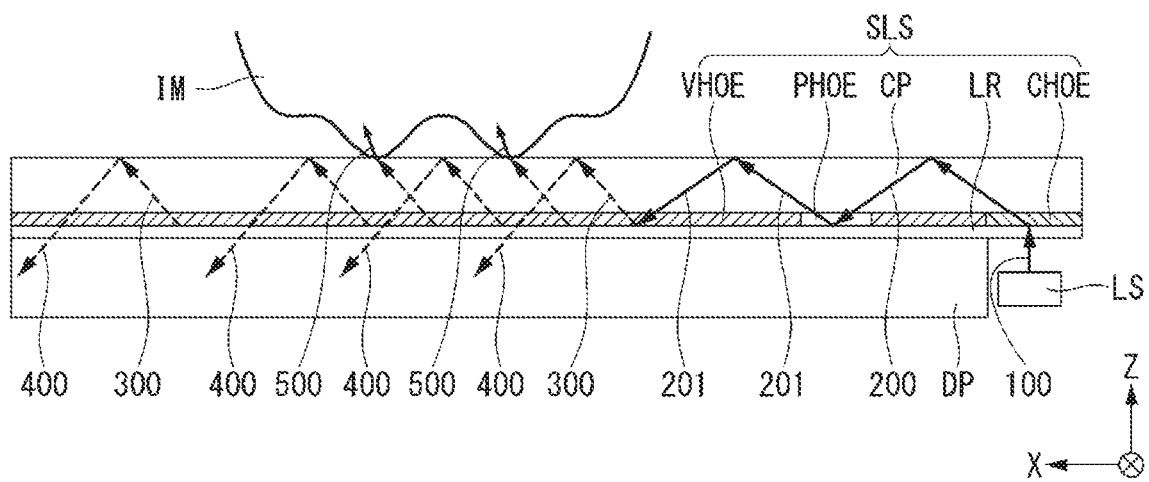
FIG. 4 is a drawing illustrating a structure of a flat panel display embedding an optical image sensor including a directional optical unit and an optical sensor, according to a second embodiment of the present disclosure.
Figure 4:
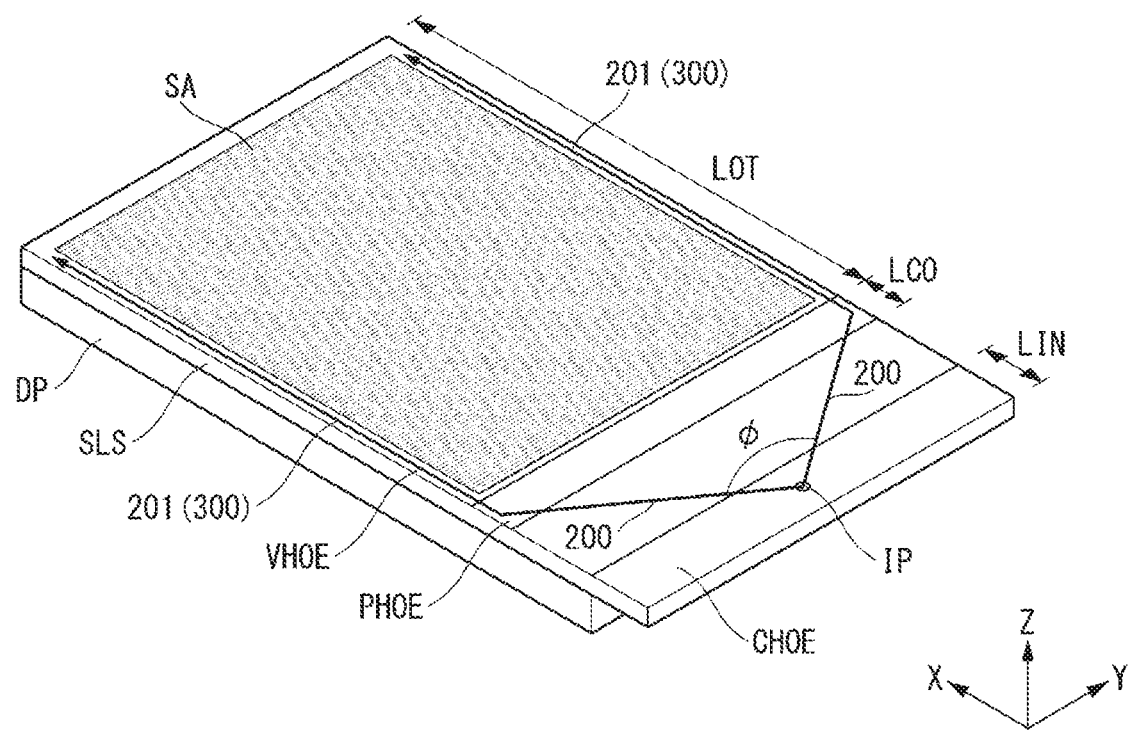

Hereinafter, referring to FIG. 4, we will explain about the second embodiment of the present disclosure. FIG. 4 is a drawing illustrating a structure of a flat panel display embedding an optical image sensor including a directional optical unit and an optical sensor, according to the second embodiment of the present disclosure.

In the second embodiment of the present disclosure, we will explain about the case in which the image sensing area SA is much wider than the first embodiment. Specifically, most of the display area AA may be defined as the image sensing area SA.

The flat panel display embedding the optical image sensor is basically similar with the first embodiment. The different point is that the flat panel display embedding the optical image sensor according to the second embodiment further comprises a horizontal collimating film PHOE for collimating the expanded propagating light 200 on the XY plane as having the collimated width corresponding to the width of the cover plate CP.

The horizontal collimating film PHOE is disposed as being spaced apart from the light incident film CHOE toward the direction of the propagating light 200 along the X axis, and as covering the width of the cover plate CP. Here, the distance from the light incident film CHOE to the horizontal collimating film PHOE may be decided variously according to the desired position and/or shape of the sensing area SA. For example, when the image sensing area SA is covering the ⅔ portions of the cover plate CP, the horizontal collimating film PHOE may be placed at the ⅓ length position of the cover plate CP from the light incident film CHOE.

In that case, the expanding angle φ may be corresponding to the inner angle between two lines connecting the light incident point IP to each of both length end points of the horizontal collimating film PHOE, respectively. The propagating light 200 having the expanding angle φ would be converted into a horizontally collimated propagating light 201 by the horizontal collimating film PHOE. Here, the radiating lights 300 would be evenly distributed over the area covering ⅔ of the area of the cover plate CP. The horizontal collimated film PHOE may be an optical element having a holographic pattern configured to collimate the propagating light 200 having the expanding angle of φ on the horizontal plane so as to correspond to the width of the cover plate CP.

Further referring to the perspective view shown in the lower portion of FIG. 4, the horizontal collimating film PHOE may be disposed at a light covering part LCO defined at the position being apart from the light entering part LIN with a predetermined distance. In the second embodiment, the image sensing area SA would be substantially same with the light going-out part LOT.

Third Embodiment

Figure 5:
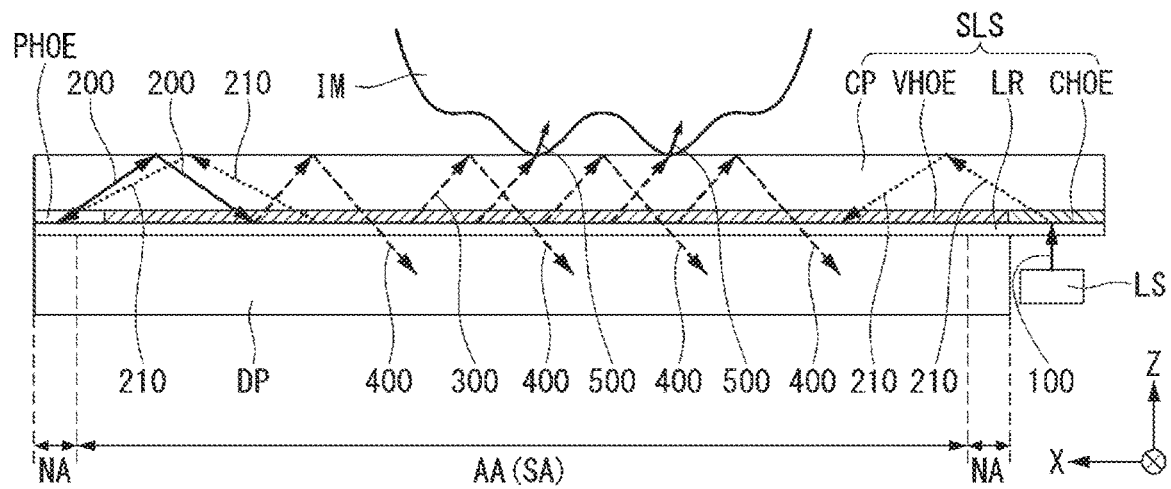
FIG. 5 is a drawing illustrating a structure of a flat panel display embedding an optical image sensor including a directional optical unit and an optical sensor, according to a third embodiment of the present disclosure.
Figure 5:
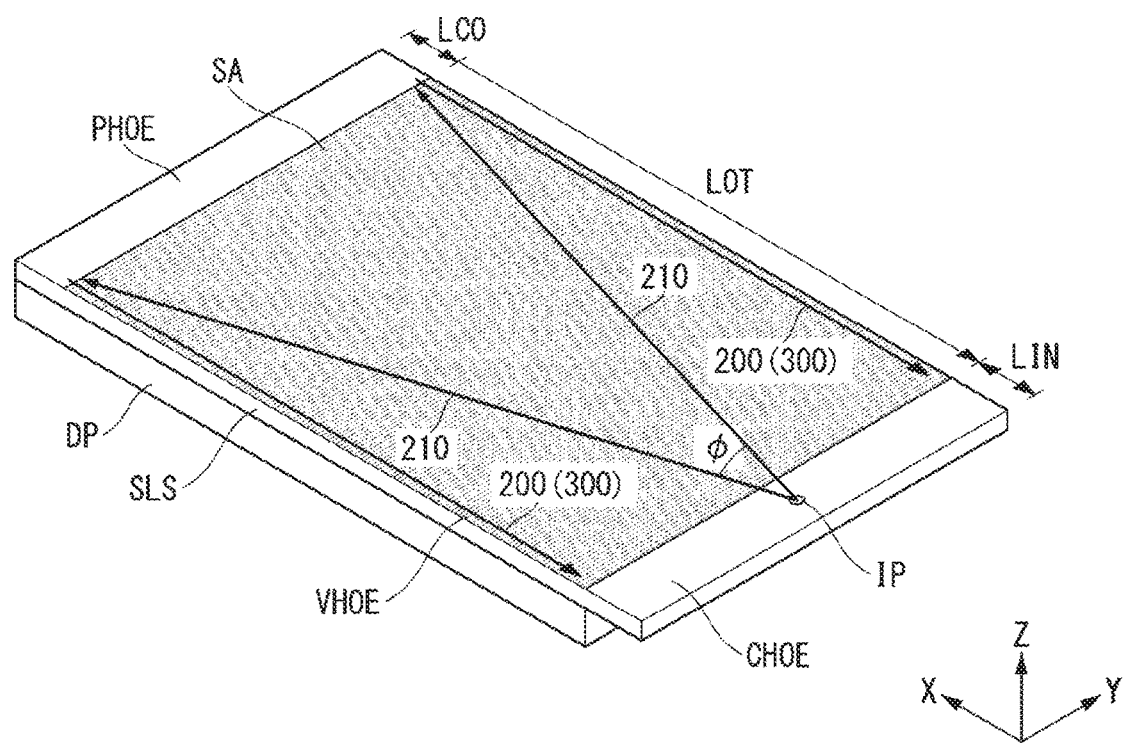

Hereinafter, referring to FIG. 5, we will explain about the third embodiment of the present disclosure. FIG. 5 is a drawing illustrating a structure of a flat panel display embedding an optical image sensor including a directional optical unit and an optical sensor, according to the third embodiment of the present disclosure.

In the third embodiment, the whole of the display area AA of the display panel DP would be used for the image sensing area SA. The flat panel display embedding an optical image sensor is very similar with the second embodiment. The difference is that the horizontal collimating film PHOE is disposed at the opposite end non-display area NA of the cover plate CP facing with the light incident film CHOE. Further, the radiating lights 300 are provided as the propagating light 200 goes back to the light incident film CHOE from the horizontal collimated film PHOE.

The flat panel display embedding an optical image sensor according to the third embodiment of the present disclosure comprises a directional optical substrate SLS, a display panel DP and a light source LS. The directional optical substrate SLS is joined on the upper surface of the display panel DP. The light source LS is disposed under the directional optical substrate SLS at one side of the display panel DP.

The directional optical substrate SLS includes a cover plate CP, a light incident film CHOE, a light radiating film VHOE, a horizontal collimating film PHOE and a low refractive layer LR. The light radiating film VHOE may be disposed as corresponding to the display area AA of the display panel DP. The light incident film CHOE is disposed in a non-display area NA at one side of the display panel DP, laterally near the light radiating film VHOE. The horizontal collimating film PHOE is disposed in a non-display area NA at other side of the display panel DP, laterally near the light radiating film VHOE. The light incident film CHOE and the horizontal collimating film PHOE are disposed at both end sides of the cover plate CP, respectively, as facing each other with respect to the light radiating film VHOE.

Specifically, the light incident film CHOE may be disposed at an exterior area out of the non-display area NA of the display panel DP. In that case, the light source LS may be disposed at the outside of the display panel DP as facing with the light incident film CHOE.

The light incident film CHOE may convert the incident light 100 to a total reflecting light 210 and provide it inside the cover plate CP. The total reflecting light 210 is propagating to the horizontal collimating film PHOE as repeating the total reflection within the cover plate CP. In this processing, the total reflecting light 210 is not converted into the radiating light 300 by the light radiating film VHOE. Therefore, all of the total reflecting lights 210 transmit the light radiating film VHOE and are totally reflected by the interface between the light radiating film VHOE and the low refractive layer LR.

The horizontal collimating film PHOE converts the total reflecting lights 210 into the propagating lights 200 and sends them inside the cover plate CP. As the results, the propagating lights 200 are sent from the horizontal collimating film PHE to the light incident film CHOE. In this process, some of the propagating lights 200 would be converted into the radiating lights 300 and sent inside the cover plate CP by the light radiating film VHOE, like in the first and second embodiments. The radiating light 300 is totally reflected at the upper surface of the cover plate CP and transmits through the light radiating film VHOE and the low refractive layer LR disposed under the bottom surface of the cover plate CP, and then goes out.

Figure 6A:
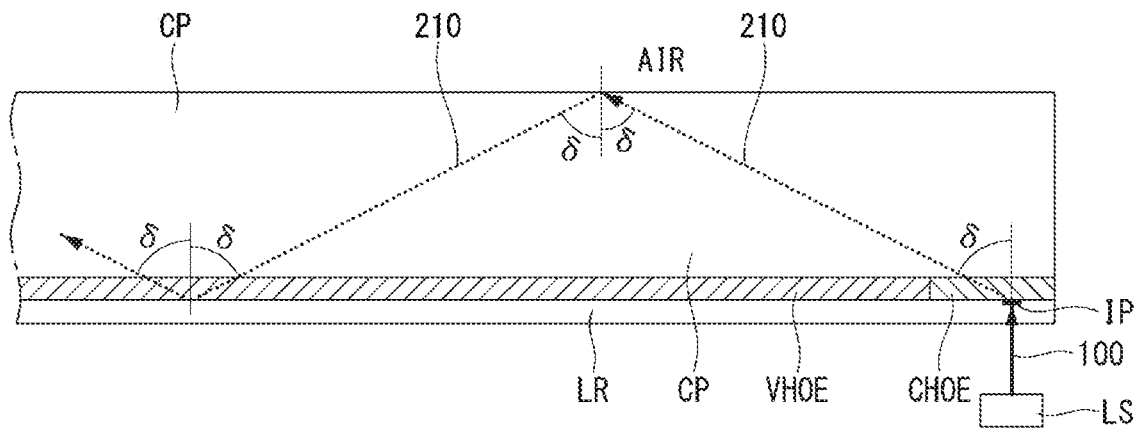
FIGS. 6A and 6B are cross sectional views illustrating light paths inside the directional optical substrate according to the third embodiment.
Figure 6B:
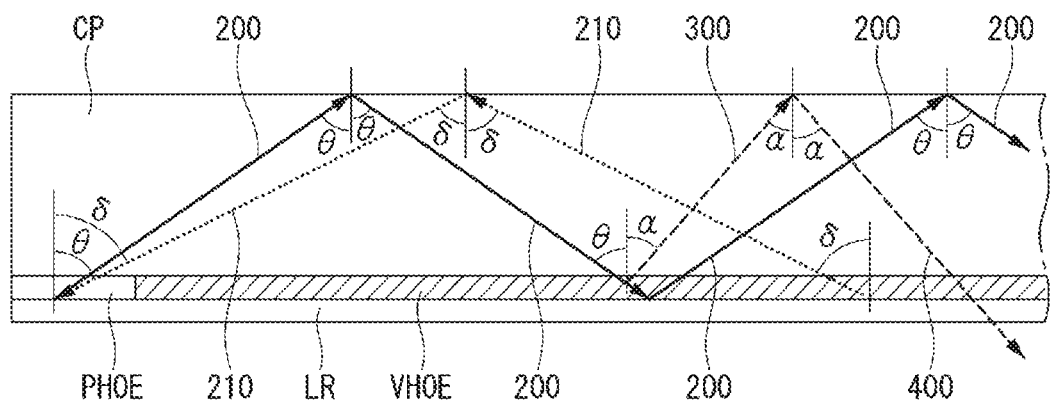

The radiating lights 300 provided by the directional optical unit according to the third embodiment of the present disclosure is different from those of the first embodiment and the second embodiment. Further referring to FIGS. 6A and 6B, we will explain about the process for providing the radiating lights 300 horizontally collimated according to the third embodiment, in detail. FIGS. 6A and 6B are cross sectional views illustrating light paths inside the directional optical substrate according to the third embodiment.

The incident light 100 having a predetermined cross sectional area and provided from the light source LS enters onto the light incident point IP of the light incident film CHOE. Specifically, the incident light 100 enters along a normal direction with respect to the surface of the light incident point IP. The incident light 100 would be converted into a total reflecting light 210 by the light incident film CHOE. Here, the total reflecting light 210 has an incident angle δ satisfying the internal total reflection condition inside the cover plate CP.

Specifically, it is preferable that the incident angle of the total reflecting light 210 satisfies the condition in which the total reflecting light 210 is not affected by the light radiating film VHOE at all and transmits it. To do so, it is preferable that the light radiating film VHOE is an optical element having a holographic pattern by which some of the lights having the incident angle θ are converted into the radiating lights 300. Further, it is preferable that the incident angle of the total reflecting light 210 is the total reflection angle δ, which is different from the incident angle θ of the propagating light 200. That is, the total reflection angle δ may be larger or smaller than the incident angle θ, but not equal. Here, in convenience, the total reflection angle δ is larger than the incident angle θ.

In the third embodiment, the light incident film VHOE is preferably a transparent film having a holographic pattern by which the incident light 100 is converted to the total reflecting light 210 having the total reflection angle δ different from the incident angle θ, and sending the total reflecting light 210 into the cover plate CP. The total reflecting light 210 would be propagated from the light incident film CHOE to the horizontal collimating film PHOE along the length axis, the X-axis.

The total reflecting light 210 would be converted to the propagating light 200 by the horizontal collimating film PHOE. The propagating light 200 may have very similar optical properties as the propagating light 200 explained in the first and the second embodiments. One difference is in that the propagating direction is opposite. For example, the propagating light 200 of the third embodiment goes from the horizontal collimating film PHOE to the light incident film CHOE.

In FIG. 6b, the horizontal collimating film PHOE is disposed under the bottom surface of the cover plate CP as being near to the light radiating film VHOE. However, it is not restricted to this structure. In some cases, the horizontal collimating film PHOE may be disposed on the top surface of the cover plate CP. Alternatively, two of the horizontal collimating films PHOE may be disposed on the cover plate CP, on the top surface and under the bottom surface of the cover plate CP, respectively, with the two horizontal collimating films PHOE facing each other.

The propagating light 200 would be totally reflected at the top surface of the cover plate CP and then converted to the radiating light 300 by the light radiating film VHOE. Here, the radiating light 300 may have very similar optical properties with those of the first and the second embodiments. A difference is that the propagating direction may be opposite.

In summary, the incident light 100 is converted to the total reflecting light 210 having the total reflection angle δ by the light incident film CHOE. The total reflecting light 210 propagates from the light incident film CHOE to the horizontal collimating film PHOE as repeating the internal total reflections within the cover plate CP. By the horizontal collimating film PHOE, the total reflecting light 210 would be converted to the propagating light 200 having the incident angle θ. The propagating light 200 goes from the horizontal collimating film PHOE to the light incident film CHOE as repeating the internal total reflections within the cover plate CP. By the light radiating film VHOE, some of the propagating light 200 would be converted to the radiating light 300 having the reflection angle α. Other portions of the propagating light 200 would be totally reflected at the interface between the light radiating film VHOE and the low refractive layer LR to the top surface of the cover plate CP.

It is preferable that the incident angle θ of the propagating light 200 is larger than the internal total reflection critical angle $T_{VHOE\_LR}$ at the interface between the light radiating film VHOE and the low refractive layer LR. Further, it is preferable that the total reflection angle δ of the total reflecting light 210 is larger than the incident angle θ of the propagating light 200. For example, when the cover plate CP and the light radiating film VHOE have the refractive index of 1.5, and the low refractive layer LR has the refractive index of 1.4, the $T_{VHOE\_LR}$ at the interface between the light radiating film VHOE and the low refractive layer LR would be about 69°. Therefore, it is preferable that the incident angle θ of the propagating light 200 is larger than 69°.

As the upper surface of the cover plate CP is in contact with the air AIR, the total reflecting light 210 and the propagating light 200 are totally reflected at the upper surface of the cover plate CP. It is because that the total reflection critical angle $T_{CP\_AIR}$ at the interface between the cover plate CP and the air AIR is about 41.4°. That is, when the total reflection angle δ and the incident angle θ are larger than the total reflection critical angle $T_{VHOE\_LR}$ at the interface between the light radiating film VHOE and the low refractive layer LR, the total reflection angle δ and the incident angle θ are always larger than total reflection critical angle $T_{CP\_AIR}$ at the interface between the cover plate CP and the air AIR.

For example, it is preferable that the incident angle θ may be in a range of 70° to 75°, inclusive. Further, it is preferable that the total reflection angle δ may be in a range of 75° to 80°, inclusive. In addition, the reflection angle δ of the radiating light 300 may be in a range of 45° to 55°, inclusive.

Referring to the perspective view shown at lower portion of FIG. 5, we will explain about the image sensing area SA. In the third embodiment, the total reflecting light 210 having the expanding angle φ goes to the horizontal collimating film PHOE from the incident point IP. When being converted from the total reflecting light 210 to the propagating light 200 by the horizontal collimating film PHOE, the propagating light 200 is horizontally collimated with respect to the propagating direction on the XY plane corresponding to the width of the cover plate CP.

For the flat panel display embedding an optical image sensor according to the third embodiment of the present disclosure, the whole area of the light radiating film VHOE disposed between the light incident film CHOE and the horizontal collimating film PHOE is corresponding to the image sensing area SA. Specifically, the light radiating film VHOE may be disposed as aligned with and overlapping the display area AA of the display panel DP. In this case, the whole area of the display area AA would be used for the image sensing area SA.

In order that the directional optical substrate SLS provides the directional sensing lights 400 as covering whole surface of the display panel DP, it is preferable that the propagating light 200 is configured to propagate in a manner of satisfying the internal total reflection condition inside the cover plate CP. The directional optical substrate SLS is attached on the top surface of the display panel DP. When the low refractive layer LR is omitted between the cover plate CP and the display panel DP, the propagating light 200 is not propagated by repeating the total reflection process inside the cover plate CP. Here, the term of 'low' in the low reflective layer LR is used for representing a meaning that the refractive index of the low reflective layer LR is lower than the refractive index of the cover plate CP and the display panel DP.

Fourth Embodiment

Figure 7A:
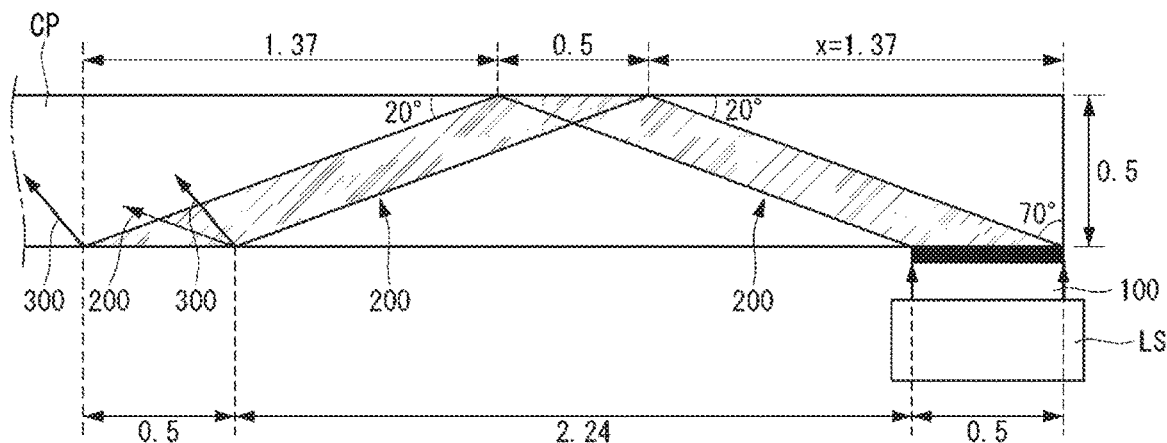
FIGS. 7A and 7B are cross sectional views illustrating how the lights are provided in view of the relationship of the cover plate and the light source in the direction optical unit according to a fourth embodiment of the present disclosure.
Figure 7B:
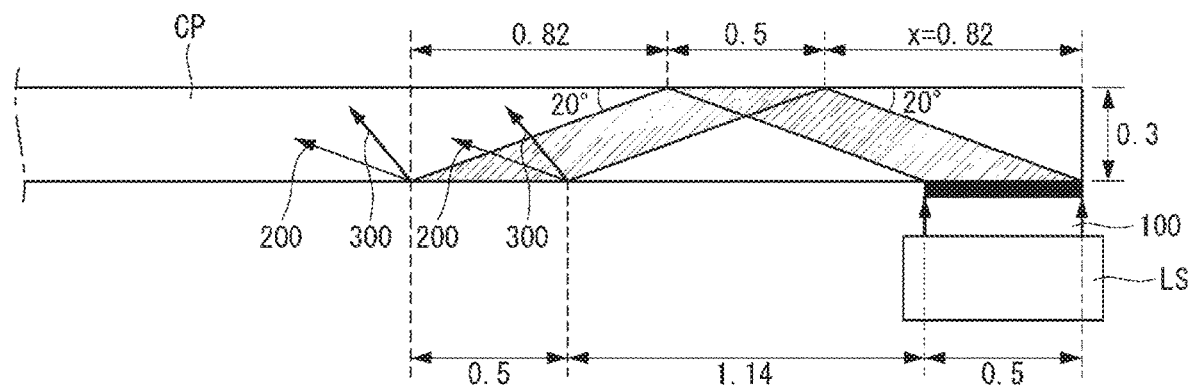

Until now we have explained about the directional optical unit focusing on the directional optical substrate SLS. Hereinafter, we will explain about the configurations of the light source LS, in detail. FIGS. 7A and 7B are cross sectional views illustrating how the lights are provided in view of the relationship of the cover plate and the light source in the direction optical unit according to the fourth embodiment. Hereinafter drawings are enlarged drawings for showing the light paths. For convenience, the light radiating film VHOE, the light incident film CHOE and the low refractive layer LR are not shown. However, referring to above mentioned drawings, the total structure will be readily understood, including the light radiating film VHOE, the light incident film CHOE and the low refractive layer LR.

Referring to FIG. 7A, the cover plate CP may be a transparent glass substrate having a thickness of about 0.5 mm. The light source LS may provide an infrared laser beam of which cross section is a circle having 0.5 mm diameter. FIG. 7A is a cross sectional view illustrating the area for providing the radiating light when the cover plate is 0.5 mm thickness. In that case, the incident light 100 is converted to the propagating light 200 having the incident angle of 70° and sent into the cover plate CP.

The propagating light 200 goes as repeating the total reflection processing within the cover plate CP. As the result, the propagating lights 200 hitting the light radiating film are not continuously distributed but are discretely distributed. For the case of 70° incident angle, as shown in FIG. 7A, there is a distance of 2.24 mm between the first hit area (or radiating area) of the propagating light 200 and the second hit area of the propagating light 200 to the light radiating film. As the diameter of the incident light 100 is 0.5 mm, there is a distance of 2.24 mm between each of the hit area of 0.5 mm diameter. That is, the radiating lights 300 are provided at the 0.5 mm hit areas arrayed with 2.24 mm distance (or gap).

Under the same condition, the distance (or gap) of the hit areas may be varied according to the thickness of the cover plate CP. For example, the cover plate CP may have the thickness of 0.3 mm. FIG. 7B is a cross sectional view illustrating the area for providing the radiating light when the cover plate is 0.3 mm thickness. For the case of 70° incident angle, as shown in FIG. 7B, there is a distance of 1.14 mm between the first hit area of the propagating light 200 and the second hit area of the propagating light 200 to the light radiating film. As the diameter of the incident light 100 is 0.5 mm, there is a distance of 1.14 mm between each of the hit area of 0.5 mm diameter. That is, the radiating lights 300 are provided at the 0.5 mm hit areas arrayed with 1.14 mm distance (or gap).

Fifth Embodiment

Figure 8:
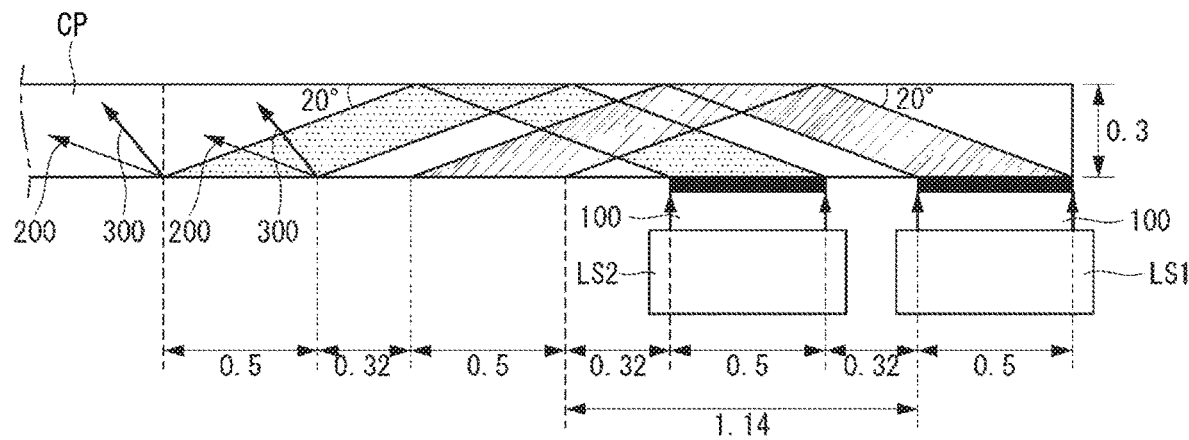
FIG. 8 is a cross sectional view illustrating profiles of the lights inside the directional optical unit according to a fifth embodiment of the present disclosure.

Now, we will explain about the structure for enhancing the image sensing resolution by reducing the distance between each hit areas generating the radiating lights 300. In the fifth embodiment, a structure is provided in which two light sources are disposed to reduce the distance or gap between each hit areas providing the radiating lights. FIG. 8 is a cross sectional view illustrating profiles of the lights inside the directional optical unit according to the fifth embodiment.

Referring to FIG. 8, the directional optical unit according to the fifth embodiment of the present disclosure comprises a directional optical substrate SLS and two light sources LS1 and LS2. The directional optical substrate SLS includes a cover plate CP, a light radiating film VHOE, a light incident film CHOE and a low refractive layer LR. The cover plate CP may be a transparent glass substrate of which thickness is 0.3 mm.

The first light source LS1 and the second light source LS2 are disposed as facing the light incident film CHOE, and as being neighbored along the X axis, the length direction of the cover plate CP. Specifically, the first and the second light sources LS1 and LS2 may provide the infrared laser beam having 0.5 mm diameter circle shapes, respectively. The light sources LS1 and LS2 may be spaced apart from each other by a distance of 0.32 mm.

When the incident angle is 70°, as shown in FIG. 8, there is a distance of 1.14 mm between the first hit area and the second hit area of the propagating light 200 from the first light source LS1. In addition, there is also a distance of 1.14 mm between the first hit area and the second hit area of the propagating light 200 from the second light source LS2.

As the results, there is 0.32 mm gap between each hit area of the propagating light 200 having 0.5 mm diameter. That is, the radiating lights 300 may be provided from the 0.5 mm hit areas arrayed with the gap of 0.32 mm.

Sixth Embodiment

Figure 9:
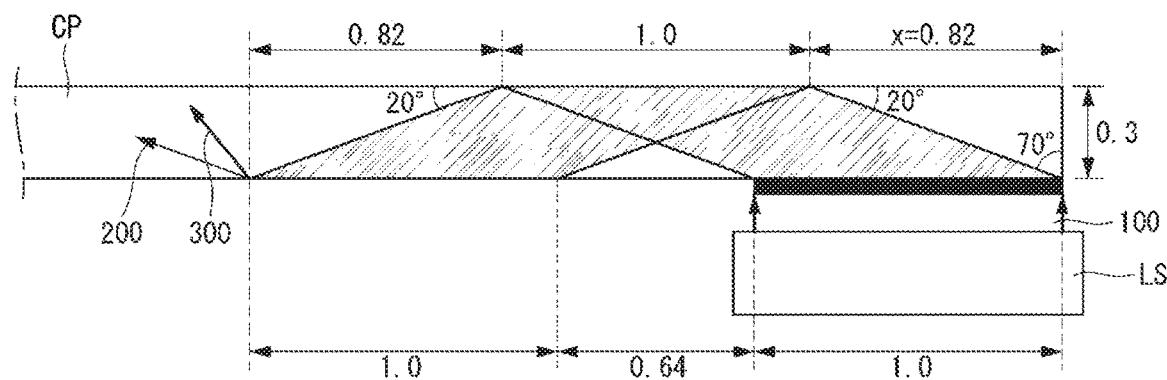
FIG. 9 is a cross sectional view illustrating profiles of the lights inside the directional optical unit according to a sixth embodiment of the present disclosure.
Figure 9:
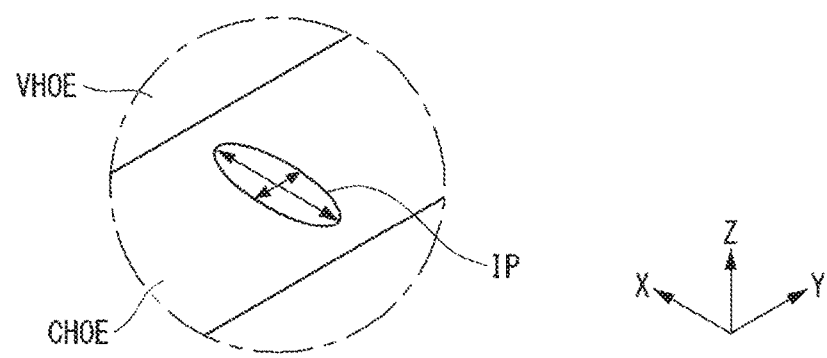

In the sixth embodiment, a structure is provided for reducing the gap between neighboring hit areas providing the radiating lights using a light source generating the incident light 100 having an asymmetric cross sectional shape. FIG. 9 is a cross sectional view illustrating profiles of the lights inside the directional optical unit according to the sixth embodiment.

Referring to FIG. 9, the directional optical unit according to the sixth embodiment of the present disclosure comprises a directional optical substrate SLS and a light source LS. The directional optical substrate SLS includes a cover plate CP, a light radiating film VHOE, a light incident film CHOE and a low refractive layer LR. The cover plate CP may be a transparent glass substrate of which thickness is 0.3 mm.

The light source LS may generate an infrared laser beam of which cross sectional area is an asymmetric shape, such as an ellipse. For example, the ellipse shapes of the laser beam provided from the light source LS may have a first axis and a second axis, perpendicular each other. In one or more embodiments, the length ratio of the first axis and the second axis may be in a range of 1:2 to 1:4, inclusive. Further, the first axis may be disposed along the Y axis, the width direction of the cover plate CP and the second axis may be disposed along the X axis, the length direction of the cover plate CP. For example the cross sectional shape of the incident light 100 provided from the light source may be an ellipse in which the length axis is 1.0 mm and the width axis is 0.5.mm.

When the incident angle is 70°, as shown in FIG. 9, there is a distance of 0.64 mm between the first hit area and the second hit area of the propagating light 200 from the first light source LS1 to the light radiating film VHOE.

The asymmetric cross sectional shape of the incident light 100 may have 1.0 mm along the length direction. Between each of hit areas having 1.0 mm cross sectional area, there is a 0.64 mm gap. That is, the radiating lights 300 are provided at the hit areas having 1.0 mm length arrayed with 0.64 mm gap.

Even though it is not shown, for another example, the cross sectional shape of the incident light 100 provided from the light source LS may have an ellipse in which length axis is 1.5 mm and the width axis is 0.5 mm. When the incident angle is 70°, the radiating lights 300 are provided at the hit areas having 1.5 mm length arrayed with 0.14 mm gap.

Even though it is not shown, for still another example, the cross sectional shape of the incident light 100 provided from the light source LS may have an ellipse in which length axis is 2.0 mm and the width axis is 0.5 mm. When the incident angle is 70°, the radiating lights 300 are provided at the hit areas that are overlapped each other. Therefore, there is no gap between the hit areas of the propagating lights 200. As the result, the radiating lights 300 may be covering over all area of the light radiating film. At the overlapped areas, the light brightness or intensity may be stronger than non-overlapped areas, but it does not cause any problems for detecting the image.

First Application Example

Until now, we explain about the features of the present disclosure based on the directional optical unit for providing the directional lights in the flat panel display embedding an optical image sensor. Hereinafter, we will explain about the application embodiment for the whole structure of the flat panel display embedding an optical image sensor formed by joining the flat display panel with a directional optical unit according to embodiments of the present disclosure.

Figure 10:
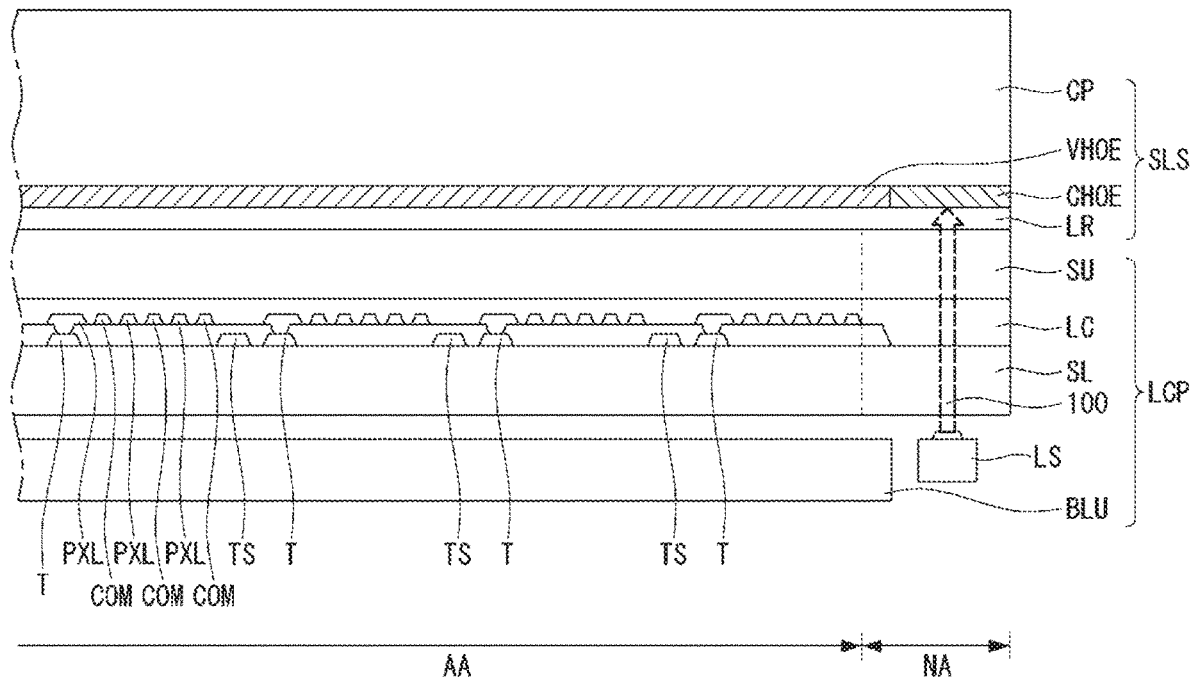
FIG. 10 is a cross sectional view illustrating a structure of a liquid crystal display embedding an optical image sensor including a directional optical unit and an optical sensor according to a first application example, in accordance with embodiments of the present disclosure.

Referring to FIG. 10, we will explain about a flat panel display embedding an optical image sensor according to the first application example. FIG. 10 is a cross sectional view illustrating a structure of a liquid crystal display embedding an optical image sensor including a directional optical unit and an optical sensor according to the first application example.

The liquid crystal display embedding an optical image sensor according to the first application example comprises a liquid crystal display panel LCP, a directional optical substrate SLS and a light source LS. The liquid crystal display panel LCP includes a lower substrate SL and an upper substrate SU joining each other and a liquid crystal layer LC disposed between the two substrates SL and SU. On the lower substrate SL, a plurality of the pixel areas are disposed in a matrix manner. At the upper substrate SU, a plurality of color filters is disposed as each color filter is corresponding to each pixel area. Otherwise, the upper substrate SU may have any additional elements as may be known. Here, the liquid crystal display panel LCP shown in FIG. 10 is one of a horizontal electric field type. However, embodiments provided herein are not restricted to this type of liquid crystal display panel, but various type liquid crystal display panels may be used.

Within each pixel area, the pixel electrode PXL and the common electrode COM are disposed for representing video images. Further, the thin film transistor T would be disposed for selectively supplying the video signal to the pixel electrode PXL. The photo sensor TS may be disposed near the thin film transistor T. At least one photo sensor TS may be disposed at each of the pixel areas. In one or more embodiments, one photo sensor TS may be disposed at a corresponding set of the pixel areas.

On the top surface of the upper substrate SU of the liquid crystal display panel LCP, the directional optical substrate SLS according to the embodiments of the present disclosure is attached in a face-to-face manner. The directional optical substrate SLS includes a cover plate CP, a light incident film CHOE, a light radiating film VHOE and a low refractive layer LR. The low refractive layer LR of the directional optical substrate SLS is attached with the top surface of the upper substrate SU.

The liquid crystal display panel LCP is one of the non-self emission display panel which cannot radiate the light. Therefore, a back light unit BLU may be required under the bottom surface of the lower substrate SL. At one lateral side, the light source LS may be disposed as facing with the light incident film CHOE. The light source LS may be configured with the back light unit BLU as the one-body system. Otherwise, the light source LS may be disposed near the back light unit BLU as being apart from the back light unit BLU.

The liquid crystal display panel LCP includes a display area AA and a non-display area NA. The light radiating film VHOE of the directional optical substrate SLS may be disposed as corresponding to the display area AA. The light source LS may be disposed in the non-display area NA as facing with the light incident film CHOE.

Second Application Example

Figure 11:
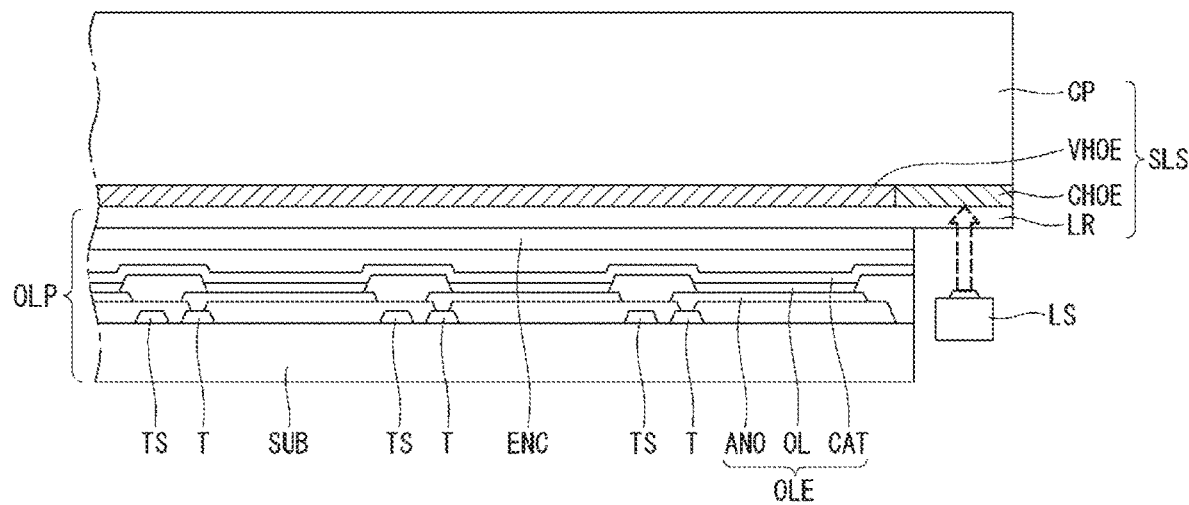
FIG. 11 is a cross sectional view illustrating a structure of an organic light emitting diode display embedding an optical image sensor including a directional optical unit and an optical sensor according to a second application example, in accordance with embodiments of the present disclosure.

Referring to FIG. 11, we will explain about a flat panel display embedding an optical image sensor according to the second application example. FIG. 11 is a cross sectional view illustrating a structure of an organic light emitting diode display embedding an optical image sensor including a directional optical unit and an optical sensor according to the second application example.

The organic light emitting diode display embedding an optical image sensor according to the second application example comprises an organic light emitting diode display panel OLP, a directional optical substrate SLS and a light source LS. The organic light emitting diode display panel OLP includes a substrate SUB having the display elements and an en-cap ENC, as attaching each other in a face-to-face manner. On the substrate SUB, a plurality of pixel areas is disposed in a matrix manner. At the en-cap ENC, a plurality of color filters may be disposed as each color filter is corresponding to each pixel area. Otherwise, the en-cap ENC may be a transparent substrate without any specific elements. Here, the organic light emitting diode display panel OLP shown in figure is one of top emission type. However, embodiments provided herein are not restricted to the top emission type, but various types including bottom emission type or both side emission type may be used.

Within each pixel area, the organic light emitting diode OLE for representing the video image and the thin film transistor T for selectively supplying the video data to the organic light emitting diode OLE are disposed. The organic light emitting diode OLE includes an anode electrode ANO, an organic light emitting layer OL and a cathode electrode CAT. The photo sensor TS may be disposed near the thin film transistor T. At least one photo sensor TS may be disposed at each of the pixel areas. Otherwise, one photo sensor TS may be disposed at a set of the pixel areas.

On the top surface of the en-cap ENC of the organic light emitting diode display panel OLP, the directional optical substrate SLS according to the embodiments of the present disclosure is attached in a face-to-face manner. The directional optical substrate SLS includes a cover plate CP, a light incident film CHOE, a light radiating film VHOE and a low refractive layer LR. The low refractive layer LR of the directional optical substrate SLS is attached with the top surface of the en-cap ENC.

The organic light emitting diode display panel OLP is one of the self-emission display panel type which can radiate the light. Therefore, it does not require the back light unit BLU. Therefore, it is preferable that the light source LS is disposed at one lateral side of the organic light emitting diode display OLP as facing with the light incident film CHOE.

In detail, the organic light emitting diode display panel OLP includes a display area AA and a non-display area NA. It is preferable that the directional optical substrate SLS has slightly larger size than the organic light emitting diode display panel OLP. The light radiating film VHOE of the directional optical substrate SLS may be disposed as corresponding to the display area AA. The light incident film CHOE may be disposed as covering an exterior space extended from one lateral side of the organic light emitting diode display panel OLP. The light source LS may be disposed under the exterior space as facing with the light incident film CHOE.

As mentioned above, the display embedding an optical image sensor includes a cover plate disposed at the outermost surface and an ultra thin film type holographic film having at most some hundreds of thickness and attached at one side of the cover plate. Therefore, the optical image sensor according to the present disclosure can be configured with the display panel in which the total thickness is not much thicker. Further, evenly distributing the highly collimated sensing lights over the most surface of the display panel, the ultra high resolution for image sensing would be acquired. Therefore, it is very efficient to detect tiny image pattern such as fingerprint or palm print, exactly.

While embodiments of the present disclosure have been described in detail with reference to the drawings, it will be understood by those skilled in the art that the disclosure can be implemented in other specific forms without changing the technical spirit or essential features of the disclosure. Therefore, it should be noted that the forgoing embodiments are merely illustrative and are not to be construed as limiting the disclosure. The scope of the disclosure is defined by the appended claims rather than the detailed description of the disclosure. All changes or modifications or their equivalents made within the meanings and scope of the claims should be construed as falling within the scope of the disclosure.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A flat panel display embedding an image sensor, comprising:
   a display panel including a display area and a non-display area, the display panel having a top surface; and
   a directional optical unit attached to the top surface of the display panel, the directional optical unit having a length along a length axis of the display panel, a width along a width axis of the display panel and a thickness along a thickness axis of the display panel, the directional optical unit including:
   a cover plate having a size corresponding to the length and the width of the directional optical unit;
   a light incident film on a bottom surface of the cover plate and disposed outside of the display area, the light incident film including a first holographic pattern;
   a light radiating film on the bottom surface of the cover plate, the light radiating film disposed adjacent to a lateral side of the light incident film and covering the display area of the display panel, the light radiating film including a second holographic pattern that is different from the first holographic pattern of the light incident film;
   a low refractive layer on the light radiating film and the light incident film, the low refractive layer attached on the top surface of the display panel and positioned between the display panel and the light radiating film, the low refractive layer having a refractive index that is lower than a refractive index of the cover plate and that is lower than a refractive index of the light radiating film;
   a light source facing the light incident film, the light source being spaced a first selected distance away from the cover plate,
   wherein the display panel comprises:
   a pixel material layer positioned spaced a second selected distance away from the bottom surface of the cover plate;
   a plurality of image pixels located within the pixel material layer; and
   a plurality of photo sensors positioned within the pixel material layer, each photo sensor being adjacent to at least one image pixel and positioned to receive light emitted from the light source that has been reflected and then passed through the light radiating film to become a sensing light,
   wherein the light source provides an incident light beam to an incident point on a surface of the light incident film, the incident light beam having a first portion of its path adjacent to the pixel material layer that passes through the holographic pattern of the light incident film prior to passing through the light radiating film, wherein the directional optical unit provides the sensing light to the display area, wherein the sensing light is collimated and directionized, and wherein the collimated and directionized sensing light is received at one or more of the photo sensors that are positioned within the pixel material layer.

2. The flat panel display according to claim 1, wherein the first holographic pattern of the light incident film converts the incident light to a propagating light having an incident angle satisfying an internal total reflection condition of the cover plate, and that transmits the propagating light to the cover plate; and wherein the second holographic pattern of the light radiating film converts a first portion of the propagating light into the sensing light, the sensing light having a reflection angle that satisfies a total reflection condition at a top surface of the cover plate and that satisfies a transmitting condition through the low refractive layer.

3. The flat panel display according to claim 2, wherein the propagating light has an expanding angle on a horizontal plane including the length axis and the width axis, and the propagating light maintains the collimated state on a vertical plane including the length axis and the thickness axis;

wherein the incident angle is larger than an internal total reflection critical angle at a first interface between the light radiating film and the low refractive layer; and wherein the reflection angle is larger than a total reflection critical angle at a second interface between the cover plate and an air layer, and smaller than the internal total reflection critical angle at the first interface between the light radiating film and the low refractive layer.

4. The flat panel display according to claim 3, wherein the expanding angle is equal to or greater than an inner angle between a first line and a second line, the first line is a straight line between the incident point and a first end of a side of the cover plate opposite to the light incident film, and the second line is a straight line between the incident point and a second end of the side of the cover plate opposite to the light incident film.

5. The flat panel display according to claim 3, wherein the directional optical unit further includes:

a horizontal collimating film disposed on the bottom surface of the cover plate between the light incident film and the light radiating film, the horizontal collimating film having a width corresponding to the width of the directional optical unit, wherein the expanding angle is equal to or greater than an inner angle between a first line and a second line, the first line is a straight line between the incident point and a first end of a side of the horizontal collimating film opposite to the light incident film, and the second line is a straight line between the incident point and a second end of the side of the horizontal collimating film opposite to the light incident film, and wherein the horizontal collimating film includes a third holographic pattern that horizontally collimates the propagating light having the expanding angle on the horizontal plane to correspond to the width.

6. The flat panel display according to claim 2, wherein the incident angle is greater than 69°.

7. The flat panel display device according to claim 6, wherein the incident angle is within a range of 70° to 75°, inclusive.

8. The flat panel display according to claim 1, wherein the directional optical unit further includes:

a horizontal collimating film disposed in the non-display area at an opposite side of the cover plate facing the light incident film, wherein the light incident film receives incident light from the light source, converts the incident light to a total reflecting light having a total reflection angle, and transmits the total reflecting light to the cover plate, the total reflecting light having an expanding angle on a horizontal plane including the length axis and the width axis, wherein the expanding angle is equal to or greater than an inner angle between a first line and a second line, the first line is a straight line between the incident point and a first end of a side of the horizontal collimating film, and the second line is a straight line between the incident point and a second end of the side of the horizontal collimating film, the second end being opposite to the first end, wherein the horizontal collimating film includes a third holographic pattern that converts the total reflecting light into a propagating light having an incident angle that is different from the total reflection angle, and horizontally collimates the propagating light and transmits the propagating light to the light incident film, and wherein the second holographic pattern of the light radiating film is for transmitting the total reflecting light through.

9. The flat panel display according to claim 8, wherein the horizontal collimating film is disposed on at least one the bottom surface of the cover plate or an upper surface of the display panel.

10. The flat panel display according to claim 1, wherein the light source provides a collimated light having a circular cross-sectional shape.

11. The flat panel display according to claim 10, wherein the light source includes at least two unit light sources disposed with a predetermined distance between them along the length direction.

12. The flat panel display according to claim 10, wherein the light source includes an ellipse cross-sectional shape having a first axis corresponding to the width direction and a second axis corresponding to the length direction, wherein a ratio of a first dimension of the ellipse along the first axis to a second dimension of the ellipse along the second axis is within a range of 1:2, inclusive, to 1:4, inclusive.

13. The flat panel display according to claim 1, wherein the refractive index of the low refractive layer is about 1.4.

14. The flat panel display device according to claim 1, wherein the refractive index of the cover plate is less than or equal to the refractive index of the light radiating film, and the refractive index of the cover plate is less than or equal to a refractive index of the light incident film.

15. The flat panel display of claim 1 wherein the pixel material layer is a liquid crystal layer.

16. The flat panel display of claim 15 further including a backlight unit positioned below and adjacent to the liquid crystal layer.

17. The flat panel display of claim 1 wherein the pixel material layer an OLED layer.

18. The flat panel display of claim 1 wherein the first selected distance is greater than the second selected distance.

19. The flat panel display of claim 1 wherein the first selected distance is approximately the same as the second selected distance.

20. A flat panel display with an embedded image sensor, comprising:
a display panel including a display area and a non-display area;
a directional optical unit attached to the display panel, the directional optical unit including:
a cover plate that covers the display panel, at least a portion of the cover plate extends beyond a first side of the display panel, the cover plate having a first surface and a second surface that is opposite the first surface;
a collimated light source positioned adjacent to the first side of the display panel, the light source faces the first surface of the cover plate at the portion of the cover plate that extends beyond the first side of the display panel;
a light incident film attached to the first surface of the cover plate at the portion of the cover plate that extends beyond the first side of the display panel, the light incident film being positioned between the light source and the cover plate, the light incident film having a first holographic pattern that converts incident light received from the light source to a propagating light having an incident angle that satisfies an internal total reflection condition of the cover plate and transmits the propagating light into the cover plate;
a light radiating film attached to the first surface of the cover plate and positioned between the cover plate and the display panel, the light radiating film having a second holographic pattern that receives the propagating light and converts a first portion of the propagating light into a sensing light, the sensing light having a reflection angle that satisfies a total reflection condition at the second surface of the cover plate and that satisfies a transmitting condition through the low refractive layer; and
a low refractive layer attached to the light radiating film and the light incident film, the low refractive layer positioned between the light radiating film and the display panel and between the light incident film and the light source, the low refractive layer having a refractive index that is lower than a refractive index of the cover plate and that is lower than a refractive index of the light radiating film,
a light source facing the light incident film, the light source being spaced a first selected distance away from the cover plate,
wherein the display panel comprises:
a pixel material layer positioned spaced a second selected distance away from the bottom surface of the cover plate;
a plurality of image pixels located in the pixel material layer, the image pixels having at least one electrode that is positioned closer to the bottom surface of the cover plate than the first selected distance, the light source being spaced laterally apart from the pixel material layer; and
a plurality of photo sensors positioned within the pixel material layer, each photo sensor being adjacent to at least one image pixel,
wherein the light source provides an incident light beam to an incident point on a surface of the light incident film;
wherein the directional optical unit provides a sensing light to the display area,
wherein the sensing light is collimated and directionized along a predetermined direction, and
wherein the collimated and directionized sensing light is received at one or more of the photo sensors that are positioned within the pixel material layer.

21. The flat panel display with an embedded image sensor according to claim 20, wherein the incident angle is greater than 69°.

22. The flat panel display with an embedded image sensor according to claim 21, wherein the incident angle is within a range of 70° to 75°, inclusive.

23. The flat panel display of claim 20 wherein the incident light beam has a first portion of its path adjacent to the pixel material layer that passes through the light incident film prior to passing through the light radiating film.

24. The flat panel display of claim 23 wherein the light source is spaced a first selected distance away from the cover plate and at least one electrode of the image pixels in the pixels material layer is spaced a second selected distance away from the cover plate,
wherein the first selected distance is greater than the second selected distance.

25. The flat panel display of claim 23 wherein the incident light beam has a first portion of its path adjacent to the pixel material layer that passes through the light incident film prior to passing through the light radiating film.

26. A flat panel display embedding an image sensor, comprising:
a display panel including a display area and a non-display area, the display panel having a top surface; and
a directional optical unit attached to the display panel, the directional optical unit having a length along a length axis of the display panel, a width along a width axis of the display panel and a thickness along a thickness axis of the display panel, the directional optical unit including:
a cover plate having a size corresponding to the length and the width of the directional optical unit;
a light incident film on a bottom surface of the cover plate and disposed outside of the display area, the light incident film including a first holographic pattern;
a light radiating film on the bottom surface of the cover plate, the light radiating film disposed adjacent to a lateral side of the light incident film and covering the display area of the display panel, the light radiating film including a second holographic pattern that is different from the first holographic pattern of the light incident film;
a low refractive layer on the light radiating film and the light incident film, the low refractive layer attached on the top surface of the display panel and positioned between the display panel and the light radiating film, the low refractive layer having a refractive index that is lower than a refractive index of the cover plate and that is lower than a refractive index of the light radiating film;
wherein the display panel comprises:
a pixel material layer having a plurality of image pixels located within the pixel material layer and a plurality of photo sensors positioned within the pixel material layer;
wherein the cover plate, the light incident film, the light radiating film and the pixel material layer form a unitary member; and a light source facing the light incident film, the light source being a separate member from the unitary member and being spaced apart from the unitary member;

wherein the light source provides an incident light beam to an incident point on a surface of the light incident film, the incident light beam passing from a location that is spaced apart from the unitary member to entering the unitary member via the first holographic pattern of the light incident film;

wherein the light source provides a sensing light to the display area, the sensing light is a collimated and directionized, and wherein the collimated and directionized sensing light is received at one or more of the photo sensors that are positioned within the pixel material layer.

* * * * *